United States Patent
Kim et al.

(10) Patent No.: US 11,327,122 B2
(45) Date of Patent: May 10, 2022

(54) VOLTAGE DETECTION INTEGRATED CIRCUIT AND BATTERY MANAGEMENT SYSTEM COMPRISING SAME

(71) Applicant: Samsung SDI Co., Ltd., Yongin-si (KR)

(72) Inventors: Hwa-Su Kim, Yongin-si (KR); Takao Hidaka, Yongin-si (KR); Cheolgi Son, Yongin-si (KR); Jiwon Jung, Yongin-si (KR); Wonkyoung Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 299 days.

(21) Appl. No.: 16/467,483

(22) PCT Filed: Oct. 26, 2017

(86) PCT No.: PCT/KR2017/011933
§ 371 (c)(1),
(2) Date: Jun. 6, 2019

(87) PCT Pub. No.: WO2018/128257
PCT Pub. Date: Jul. 12, 2018

(65) Prior Publication Data
US 2019/0339335 A1    Nov. 7, 2019

(30) Foreign Application Priority Data
Jan. 3, 2017   (KR) .......................... 10-2017-0000776

(51) Int. Cl.
*G01R 31/396*   (2019.01)
*G01R 31/3835*  (2019.01)
(Continued)

(52) U.S. Cl.
CPC ......... *G01R 31/396* (2019.01); *G01R 31/374* (2019.01); *G01R 31/3835* (2019.01); *H02J 7/0016* (2013.01); *H02J 7/0021* (2013.01)

(58) Field of Classification Search
CPC   G01R 31/396; G01R 31/3835; G01R 31/374; G01R 19/32; G01R 31/36;
(Continued)

(56) References Cited

U.S. PATENT DOCUMENTS

| 9,746,525 B2 | 8/2017 | Kudo et al. | |
| 2008/0088279 A1* | 4/2008 | Lim | G01R 31/396 |
| | | | 320/134 |

(Continued)

FOREIGN PATENT DOCUMENTS

| CN | 101188316 A | 5/2008 |
| CN | 101714674 A | 5/2010 |

(Continued)

OTHER PUBLICATIONS

Korean Office Action dated Feb. 25, 2021, issued in corresponding Korean Patent Application No. 10-2017-0000776 (9 pages).

(Continued)

*Primary Examiner* — Nha T Nguyen
(74) *Attorney, Agent, or Firm* — Lewis Roca Rothgerber Christie LLP

(57) ABSTRACT

A voltage detection integrated circuit may include: a voltage detection circuit electrically connected to a plurality of cells to detect a cell voltage of a corresponding one of the plurality of cells; a plurality of cell balancing switches configured to conduct or block a flow of a balancing current of a corresponding cell among the plurality of cells; a temperature sensor configured to detect an internal temperature of the voltage detection integrated circuit; and a controller configured to differently select a number of cell (Continued)

balancing switches that are simultaneously turned on depending on the internal temperature, and to turn on the selected switches, when the internal temperature is below a first threshold value.

20 Claims, 9 Drawing Sheets

(51) Int. Cl.
*G01R 31/374* (2019.01)
*H02J 7/00* (2006.01)

(58) Field of Classification Search
CPC .... G01R 31/388; H02J 7/0016; H02J 7/0021; H02J 7/0029; H02J 7/007192; Y02E 60/10; Y02T 10/70; H01M 10/42; H01M 10/48; H01M 10/63; H01M 10/425; H01M 10/486; H01M 2010/4271
See application file for complete search history.

(56) References Cited

U.S. PATENT DOCUMENTS

| | | |
|---|---|---|
| 2010/0079112 A1 | 4/2010 | Nagashima |
| 2011/0121787 A1 | 5/2011 | Kim et al. |
| 2012/0133330 A1 | 5/2012 | Kamata et al. |
| 2013/0033231 A1 | 2/2013 | Zhang |
| 2013/0187660 A1* | 7/2013 | Ishikawa ............ H01M 10/482 324/433 |
| 2014/0042977 A1 | 2/2014 | Kim |
| 2014/0152261 A1 | 6/2014 | Yamauchi et al. |
| 2014/0184168 A1 | 7/2014 | Park |
| 2014/0225622 A1* | 8/2014 | Kudo ..................... B60L 50/66 324/433 |
| 2015/0035495 A1 | 2/2015 | Yoshida |
| 2015/0153416 A1* | 6/2015 | Umemura ........... H01M 10/443 320/107 |

FOREIGN PATENT DOCUMENTS

| | | |
|---|---|---|
| CN | 102082310 A | 6/2011 |
| CN | 202121023 U | 1/2012 |
| CN | 102427256 A | 4/2012 |
| CN | 202651843 U | 1/2013 |
| CN | 102916458 A | 2/2013 |
| CN | 203481854 U | 3/2014 |
| CN | 103765721 A | 4/2014 |
| CN | 104145399 A | 11/2014 |
| CN | 204694377 U | 10/2015 |
| JP | 2005-348457 A | 12/2005 |
| JP | 2008-141953 A | 6/2008 |
| JP | 2008-141954 A | 6/2008 |
| JP | 2014-36575 A | 2/2014 |
| JP | 5683710 B2 | 3/2015 |
| JP | 2015-112007 A | 6/2015 |
| KR | 10-2012-0059247 A | 6/2012 |
| KR | 10-1263385 B1 | 5/2013 |
| KR | 10-2014-0084691 A | 7/2014 |
| KR | 10-2014-0111187 A | 9/2014 |

OTHER PUBLICATIONS

Extended European Search Report for corresponding European Patent Application No. 17889917.5, dated Aug. 5, 2020, 7 pages.
Chinese Office Action, with English translation, dated Nov. 30, 2020, for corresponding Chinese Patent Application No. 201780082162.6 (30 pages).
Chinese Office action dated Nov. 30, 2020 cited in corresponding Chinese Patent Application No. 201780082162.6, with English translation, 30 pages.
Tongxian, Yang, Thermal Resistance Multi-Channel Switching Temperature Automatic Detection, Wuhan Institute of Chemical Technology, copyright 1994-2021 China Academic Journal Electronic Publishing House, with English abstract, 5 pages.

* cited by examiner

VOLTAGE DETECTION INTEGRATED CIRCUIT AND BATTERY MANAGEMENT SYSTEM COMPRISING SAME

CROSS-REFERENCE TO RELATED APPLICATION(S)

This application is a National Phase Patent Application of International Patent Application Number PCT/KR2017/011933, filed on Oct. 26, 2017, which claims priority of Korean Patent Application No. 10-2017-0000776, filed Jan. 3, 2017. The entire contents of both of which are incorporated herein by reference.

TECHNICAL FIELD

Recently, according to strengthening of environmental regulations including $CO_2$ regulations, interest in environmentally-friendly vehicles has been increasing. Accordingly, vehicle companies have been actively researching and developing pure electrical vehicles and hydrogen vehicles, as well as hybrid and plug-in hybrid vehicles.

BACKGROUND ART

A high-voltage battery for storing electrical energy obtained from various energy sources is applied to the environmentally-friendly vehicles. A high voltage battery includes a plurality of cells in series or in parallel to provide high voltage electrical energy.

A battery management system (BMS) for managing a high voltage battery is mounted in a vehicle to which the high voltage battery is applied. A cell balancing function which compensates a voltage deviation between cells by monitoring the voltage of each of the cells is one of the main functions of the battery management system. The battery management system calculates a state of charge (SOC) based on voltage, current, and temperature information of each cell that constitutes the high voltage battery, and performs cell balancing to compensate for voltage deviation when a SOC difference between the cells is equal to or higher than a predetermined level.

The SOC is used to predict available capacity, cycle-life, etc. of a battery in addition to the cell balancing. Therefore, it is necessary to accurately calculate the SOC to improve usability and stability of the battery. Calculation accuracy of SOC is closely related to measurement accuracy of cell voltage and temperature.

The cell voltage measurement in the battery management system is performed by an integrated circuit (IC), e.g., an analog front end (AFE) IC, having a built-in voltage detection circuit. In general, the measurement accuracy of a cell voltage of an integrated circuit at a low temperature is significantly lower than at room temperature, and the calculation accuracy of SOC is also lowered.

DISCLOSURE

An exemplary embodiment has been made in an effort to provide a voltage detection integrated circuit and a battery management system including the same for improving cell voltage measurement accuracy in a low temperature environment.

An exemplary embodiment of the present invention provides a voltage detection integrated circuit including: a voltage detection circuit electrically connected to a plurality of cells to detect a cell voltage of a corresponding one of the plurality of cells; a plurality of cell balancing switches configured to conduct or block a flow of a balancing current of a corresponding cell among the plurality of cells; a temperature sensor configured to detect an internal temperature of the voltage detection integrated circuit; and a controller configured to differently select a number of cell balancing switches that are simultaneously turned on depending on the internal temperature, and to turn on the selected switches, when the internal temperature is below a first threshold value.

In the voltage detection integrated circuit according to the exemplary embodiment, the controller may group the plurality of cell balancing switches into a plurality of groups and alternately turns on the plurality of groups when the internal temperature is less than a first threshold value.

In the voltage detection integrated circuit according to the exemplary embodiment, the controller may control turn-on times of the plurality of groups to be the same.

In the voltage detection integrated circuit according to the exemplary embodiment, the controller may simultaneously turns on the plurality of cell balancing switches when the internal temperature is less than the first threshold value, and then may gradually increase the number of cell balancing switches that are turned off as the internal temperature rises.

In the voltage detection integrated circuit according to the exemplary embodiment, the voltage detection integrated circuit may include: a multiplexer configured to select one of the plurality of cells; a differential amplifier configured to amplify and output a voltage between opposite ends of the cell selected by the multiplexer; a reference voltage supply circuit configured to supply a reference voltage; and an analog digital converter configured to output a digital value corresponding to a cell voltage of the cell selected by the multiplexer based on the reference voltage, and the temperature sensor may be disposed in contact with or adjacent to the reference voltage supply circuit.

The voltage detection integrated circuit may further include a heat generation circuit, and the controller may receive an ambient temperature of the voltage detection integrated circuit from a temperature sensor outside the voltage detection integrated circuit, and may control the heat generation circuit to generate heat when the ambient temperature is lower than a second threshold in a state where the internal temperature reaches the first threshold value and thus the plurality of cell balancing switches are turned off.

In the voltage detection integrated circuit, the heat generation circuit may include a heat generation switch connected between a positive terminal of a first one of the plurality of cells and a negative terminal of a second one of the plurality of cells.

In the voltage detection integrated circuit, the controller may turn off the heat generation switch when the ambient temperature is equal to or higher than the second threshold.

In the voltage detection integrated circuit, the controller may calculate a heat generation amount of the heat generation circuit based on the internal temperature and the ambient temperature, and may PWM-control the heat generation switch with a duty ratio corresponding to the heat generation amount.

In the voltage detection integrated circuit, the controller may calculate a heat generation amount of the heat generation circuit based on the internal temperature and the ambient temperature, and may control a turn-on and turn-off period of the heat generation switch depending on the heat generation amount.

The voltage detection integrated circuit may further include a heat generation resistor connected between the heat generation switch and the positive terminal of the first cell or between the heat generation switch and the negative terminal of the second cell.

In addition, a battery management system may include: an integrated circuit configured to include a voltage detection circuit that is electrically connected to a plurality of cells to detect a cell voltage of a corresponding cell of the plurality of cells, a plurality of cell balancing switches that conduct or block a flow of a balancing current of a corresponding cell among the plurality of cells, and a first temperature sensor; and a battery controller configured to differently select a number of cell balancing switches that are simultaneously turned on depending on an internal temperature of the integrated circuit detected through the first temperature sensor when the internal temperature is less than a threshold value, and to turn on the selected switches.

In the battery management system, the battery controller may group the plurality of cell balancing switches into a plurality of groups and alternately turn on the plurality of groups when the first temperature is less than the first threshold value.

In the battery management system, the battery controller may control turn-on times of the plurality of groups to be the same.

In the battery management system, the battery controller may simultaneously turn on the plurality of cell balancing switches when the internal temperature is less than the first threshold value, and then may gradually increase the number of cell balancing switches that are turned off as the internal temperature rises.

The battery management system may further include a second temperature sensor configured to detect an ambient temperature of the integrated circuit, and the integrated circuit may further include a heat generation circuit that generates heat depending on the ambient temperature.

In the battery management system, the battery controller may control the heat generation circuit to generate heat when the ambient temperature is lower than a second threshold in a state where the internal temperature reaches the first threshold value and thus the plurality of cell balancing switches are turned off.

In the battery management system, the heat generation circuit may include a heat generation switch connected between a positive terminal of a first one of the plurality of cells and a negative terminal of a second one of the plurality of cells.

In the battery management system, the battery controller may turn off the heat generation switch when the ambient temperature is equal to or higher than the second threshold.

In the battery management system, the battery controller may calculate a heat generation amount of the heat generation circuit based on the internal temperature and the ambient temperature, and may control turn-on and turn-off of the heat generation switch depending on the heat generation amount.

According to the exemplary embodiment, the battery management system has an effect of improving cell voltage measurement accuracy in a low temperature environment.

MODE FOR INVENTION

Figure 1:
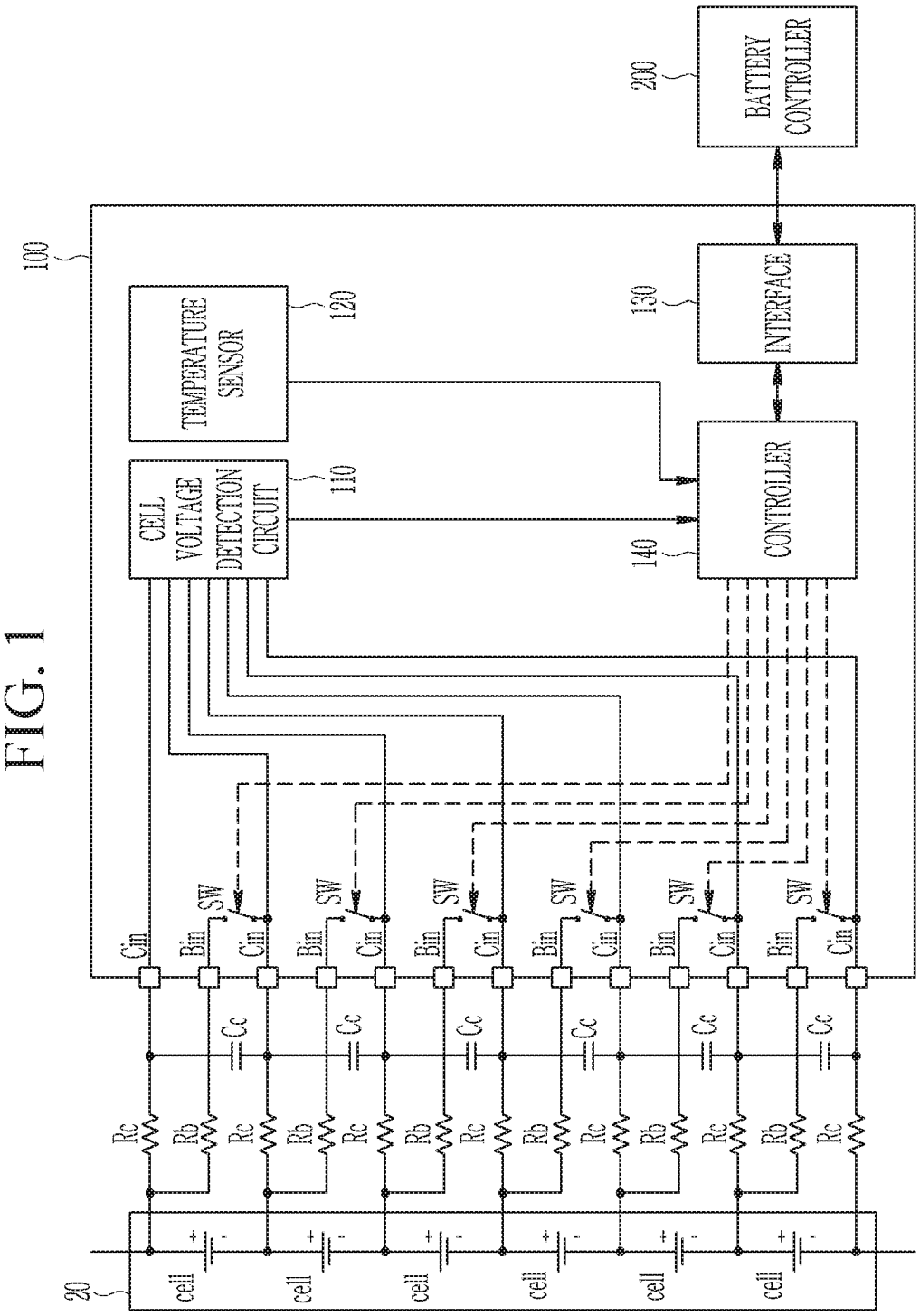
FIG. 1 schematically illustrates a battery management system according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the exemplary embodiments, parts that are irrelevant to the description are omitted, and like numerals refer to like or similar constituent elements throughout the specification. Therefore, the reference numbers of the constituent elements used in a previous drawing may be used in a subsequent drawing.

Further, since sizes and thicknesses of constituent members shown in the accompanying drawings are arbitrarily given for better understanding and ease of description, the exemplary embodiments are not limited to the illustrated sizes and thicknesses. In the drawings, the thickness of layers, films, panels, regions, etc., are exaggerated for clarity.

A case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing exemplary embodiments, an expression of connection indicates electrical connection unless explicitly described to be direct connection.

Hereinafter, a voltage detection integrated circuit (IC) and a battery management system (BMS) including the same according to exemplary embodiments will be described in detail with reference to necessary drawings. In this document, the voltage detection IC may include an analog front end (AFE) IC including a cell voltage detection function of a battery, a cell voltage monitoring (CVM) IC, and the like.

Figure 2:
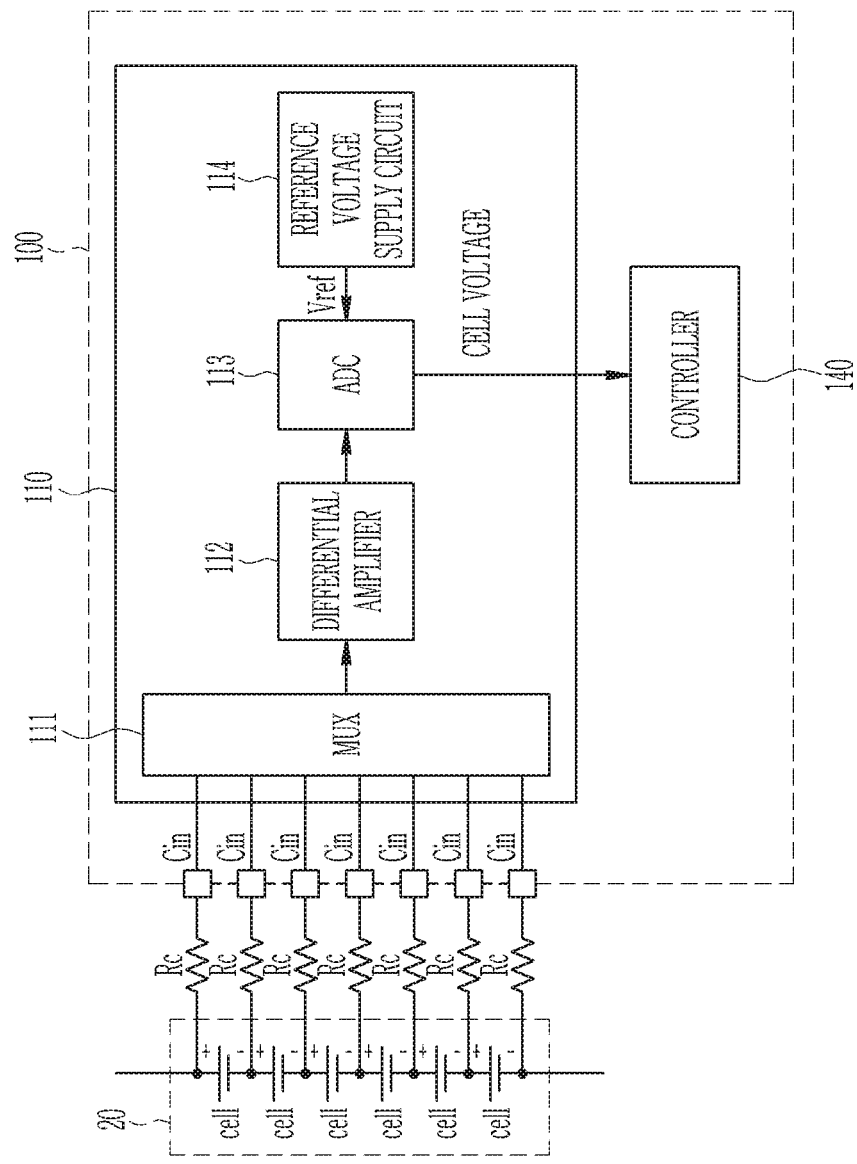
FIG. 2 schematically illustrates a configuration of a voltage detection IC according to an exemplary embodiment.
Figure 3:
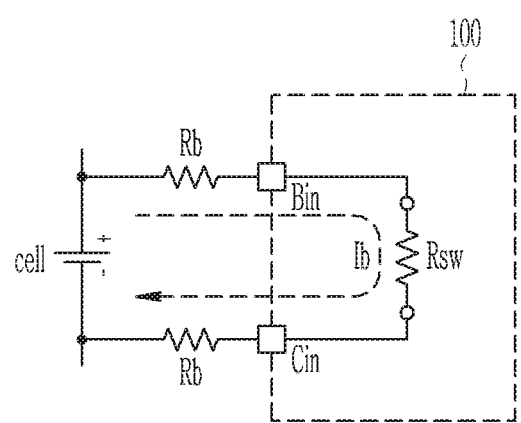
FIG. 3 illustrates a view for describing heat generation of a cell balancing switch in a battery management system according to an exemplary embodiment.

FIG. 1 schematically illustrates a battery management system according to an exemplary embodiment. FIG. 2 schematically illustrates a configuration of the voltage detection IC of FIG. 1, and FIG. 3 illustrates a view for describing heat generation of the cell balancing switch.

Referring to FIG. 1, a battery management system according to the present exemplary embodiment may include a voltage detection IC 100 and a battery controller 200.

The voltage detection IC 100 may include a plurality of cell balancing switches SW, a voltage detection circuit 110, an interface 130, and a controller 140.

The voltage detection IC 100 may be electrically connected to a cell group 20 to detect a cell voltage of each cell constituting the cell group 20 through the voltage detection circuit 110. Although a case where the cell group 20 connected to the voltage detection IC 100 includes six cells connected in series with each other is illustrated in FIG. 1 as an example, the present invention is not limited thereto, and a number of unit cells connected to the detection IC may be changed to be greater or smaller than that.

Referring to FIG. 2, the voltage detection circuit 110 may include a multiplexer (MUX) 111, a differential amplifier 112, and an analog-to-digital converter (ADC) 113. The voltage detection circuit 110 may further include a reference voltage supply circuit 114 for supplying the reference voltage Vref to the ADC 113.

An input channel of the multiplexer 111 is electrically connected to each cell constituting the cell group 20 through an input resistor Rc. The multiplexer 111 selects one of the input channels and connects it to an output channel. Specifically, the multiplexer 111 selects one of the plurality of cells connected to the input channel, and connects opposite ends of the selected cell to a positive output terminal and a negative output terminal of the output channel, respectively.

The input resistor Rc connected to the input channel of the multiplexer 111 may constitute an RC filter together with an input capacitor Cc to serve to filter a noise included in the cell voltage.

A voltage between opposite ends of the cell selected by the multiplexer 111 is amplified by the differential amplifier 112 to be outputted.

The reference voltage supply circuit 114 supplies the reference voltage Vref to the ADC 113.

The ADC 113 converts an output of the differential amplifier 112, which is an analog value, into a digital value based on the reference voltage Vref, and outputs the digital value to the controller 140. That is, the ADC 113 converts the voltage between opposite ends of the cell selected by the multiplexer 111 into a corresponding digital value and outputs it.

A cell voltage detection result outputted to the controller 140 by the ADC 113 is transferred to the battery controller 200 through the interface 130.

The interface 130 may transmit and receive data to and from the battery controller 200 using a serial peripheral interface (SPI) method such as controller area network (CAN) communication.

The battery controller 200 receiving the cell voltage detection result from the voltage detection IC 100 may control cell balancing, charging, discharging, etc. of the cell group 20 based on the result.

Referring again to FIG. 1, the voltage detection IC 100 may control cell balancing of the cells constituting the cell group 20.

Each cell balancing switch SW is connected between opposite ends of a corresponding cell through a corresponding balancing resistor Rb. Each cell balancing switch (SW) conducts or blocks a flow of a cell balancing current of the corresponding cell under control of the controller 140. When each cell balancing switch SW is turned on, the balancing current flows through the corresponding balancing resistor (Rb) to discharge the corresponding cell. On the other hand, when each cell balancing switch SW is turned off, the flow of the balancing current of the corresponding cell is blocked.

Each cell balancing switch SW may be formed of a field effect transistor (FET).

The controller 140 receives cell balancing control information from the battery controller 200 through the interface 130, and controls turn-on/turn-off of each cell balancing switch SW based on the received cell balancing control information.

When the voltage detection IC 100 is exposed to a low temperature environment, voltage detection accuracy of the voltage detection circuit 110 tends to be significantly lower than at room temperature. This is because the reference voltage supply circuit 114 for supplying the reference voltage Vref to the ADC 113 is affected by the temperature so that a level of the reference voltage Vref outputted by the reference voltage supply circuit 114 becomes different between the low temperature and the room temperature. The conversion of the ADC 113 is performed based on the reference voltage Vref. Therefore, a change in the level of the reference voltage Vref in the low temperature environment may act as a factor to increase an error of the output value of the ADC 113.

To solve this problem, the voltage detection IC 100 may further include a temperature sensor 120.

The temperature sensor 120 may detect an internal temperature of the voltage detection IC 100. The temperature sensor 120 may be disposed to be in contact with or adjacent to the reference voltage supply circuit 114 so as to detect an ambient temperature of the reference voltage supply circuit 114, which is sensitive to temperature and acts as a cause of a cell voltage detection error in the low temperature range.

The controller 140 may turn on at least one cell balancing switch SW to increase the internal temperature of the voltage detection IC 100 when the temperature detected through the temperature sensor 120 is included in the low temperature region. That is, the controller 140 may turn on at least one cell balancing switch SW to increase the temperature when the temperature detected through the temperature sensor 120 is below a threshold value. Herein, the threshold value is a boundary value for determining the low temperature region, and may be set differently depending on an environment in which the battery management system is mounted.

Referring to FIG. 3, when a cell balancing switch SW is turned on, a balancing current Ib flows into an internal resistor Rsw of the cell balancing switch SW to cause the cell balancing switch SW to generate heat. The heat generation of the cell balancing switch SW may operate as a heat source for increasing the internal temperature of the voltage detection IC 100.

The value of the internal resistor Rsw of the cell balancing switch SW varies depending on a manufacturing process and design of the voltage detection IC 100, and depends on characteristics (e.g., temperature, drain-to-source voltage, etc.) of a FET constituting the cell balancing switch SW. For example, the value of the internal resistor Rsw of the cell balancing switch SW may range from as small as 0.2 ohms up to tens of ohms.

When the cell balancing current Ib and the value of the internal resistor Rsw of each cell balancing switch SW are respectively designed to be 300 mA and 5 ohms in the voltage detection IC 100 including six connected cells, an energy amount P consumed by heat generation of the internal resistor Rsw of one cell balancing switch SW is 0.45 W. As a result, when all of the six cell balancing switches SW are turned on, the energy amount P consumed by the heat generated by the internal resistors Rsw of the six cell balancing switches SW is 2.7 W.

Meanwhile, when all of the cell balancing switches SW are simultaneously turned on to raise the internal temperature of the voltage detection IC 100, this may exceed a maximum power consumption that the voltage detection IC 100 can withstand, or may cause an excessive temperature rise of the voltage detection IC 100, leading to damage of the voltage detection IC 100.

Accordingly, the controller 140 may divide the cell balancing switches SW included in the voltage detection IC 100 into a plurality of groups, and alternately turn on each cell balancing switch group. For example, the voltage detection IC 100 may group 3 or 4 cell balancing switches SW, and may alternately turn on each cell balancing switch group. For example, the voltage detection IC 100 may group odd-numbered cell balancing switches SW and even-numbered cell balancing switches SW into different groups, and may alternately turn on each cell balancing switch group.

When a temperature rising speed for turning on the cell balancing switches SW is too fast, even if the cell balancing switch SW is turned off after reaching a desired temperature range, the temperature rise may continue for a predetermined time. This may cause an unwanted additional temperature rise, which may result in damage to the voltage detection IC 100.

Accordingly, the controller 140 may differently control a number of cell balancing switches SW that are simultaneously turned on depending on the temperature detected through the temperature sensor 120, so as to minimize an unnecessary additional temperature rise while quickly allowing the temperature of the voltage detection IC 100 to reach a room temperature region. For example, when the voltage detection IC 100 is connected to 12 cells, the number of cell balancing switches SW simultaneously turned on for a temperature rise may be controlled to be 12 at lower than −40° C., 10 in a range of −40° C. to −30° C., 8 in a range of −30° C. to −20° C., 6 in a range of −20° C. to −10° C., and 4 in a range of −10° C. to 0° C.

When the temperature is less than the threshold value, the controller 140 may turn on all the cell balancing switches SW at the same time, and then may control the cell balancing switches SW such that the number of cell balancing switches SW that are turned off gradually increases depending on the temperature rise.

In the meantime, as the cell balancing switches SW are used for increasing the temperature, it is necessary to minimize a degree to which turn-on control of the cell balancing switches for increasing the temperature deteriorates a balancing deviation between the cells or affects intercell deviation information pre-calculated by battery controller 200. However, when turn-on is allowed only for cells that require cell balancing, it may take too much time for the temperature to rise, which may reduce the temperature rise effect.

Accordingly, the controller 140 may minimize an effect of the turn-on of the cell balancing switches SW for increasing the temperature on the cell balancing by controlling a time at which a corresponding cell balancing switch SW is turned on for increasing the temperature to be the same for all the cells.

When the temperature detected by the temperature sensor 120 is equal to or higher than the threshold value, the controller 140 turns off all the cell balancing switches SW that are turned on to stop increasing the temperature using the cell balancing switches SW.

Figure 4:
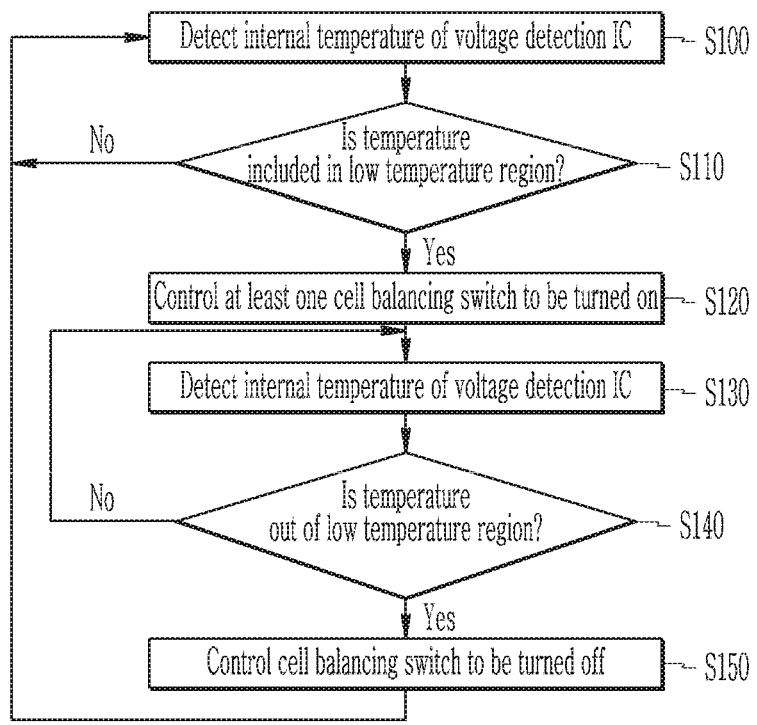
FIG. 4 schematically illustrates a control method of a cell balancing switch of a battery management system according to an exemplary embodiment.

FIG. 4 schematically illustrates a control method of the cell balancing switches of the battery management system of FIG. 1. The control method of the cell balancing switches illustrated in FIG. 4 may be performed by the voltage detection IC 100 described with reference to FIG. 1 to FIG. 3.

Referring to FIG. 4, the controller 140 detects the internal temperature of the voltage detection IC 100 through the temperature sensor 120 (S100).

The controller 140 determines whether the temperature detected through the temperature sensor 120 is included in the low temperature region by comparing the temperature detected through the temperature sensor 120 with a threshold value (S110).

The controller 140 controls at least one cell balancing switch SW to be turned on to increase the internal temperature of the voltage detection IC 100 when the temperature detected through the temperature sensor 120 is included in the low temperature region (S120).

In step S120, the controller 140 may divide the cell balancing switches SW included in the voltage detection IC 100 into a plurality of groups, and may alternately turn on each cell balancing switch group.

In step S120, the controller 140 may control the number of cell balancing switches SW that are simultaneously turned on to be different depending on the temperature detected through the temperature sensor 120. In this case, the controller 140 may control the number of cell balancing switches SW to be simultaneously turned on to increase as the temperature detected through the temperature sensor 120 is lower.

In step S120, the controller 140 may turn on all the cell balancing switches SW at the same time, and then may control the cell balancing switches SW such that the number of cell balancing switches SW that are turned off gradually increases depending on the temperature rise.

In step S120, the controller 140 may control a time at which a corresponding cell balancing switch SW is turned on for increasing the temperature to be the same for all the cells.

The controller 140 continuously detects the internal temperature of the voltage detection IC 100 through the temperature sensor 120 even while raising the internal temperature of the voltage detection IC 100 through the turn-on control of the cell balancing switches SW (S130). In addition, the controller 140 determines whether the temperature detected through the temperature sensor 120 is out of the low temperature range (S140).

When the temperature detected through the temperature sensor 120 is out of the low temperature range, the controller 140 controls all the cell balancing switches SW that are turned on for increasing the temperature to be turned off (S150), to stop heat generation of the cell balancing switches SW.

Figure 5:
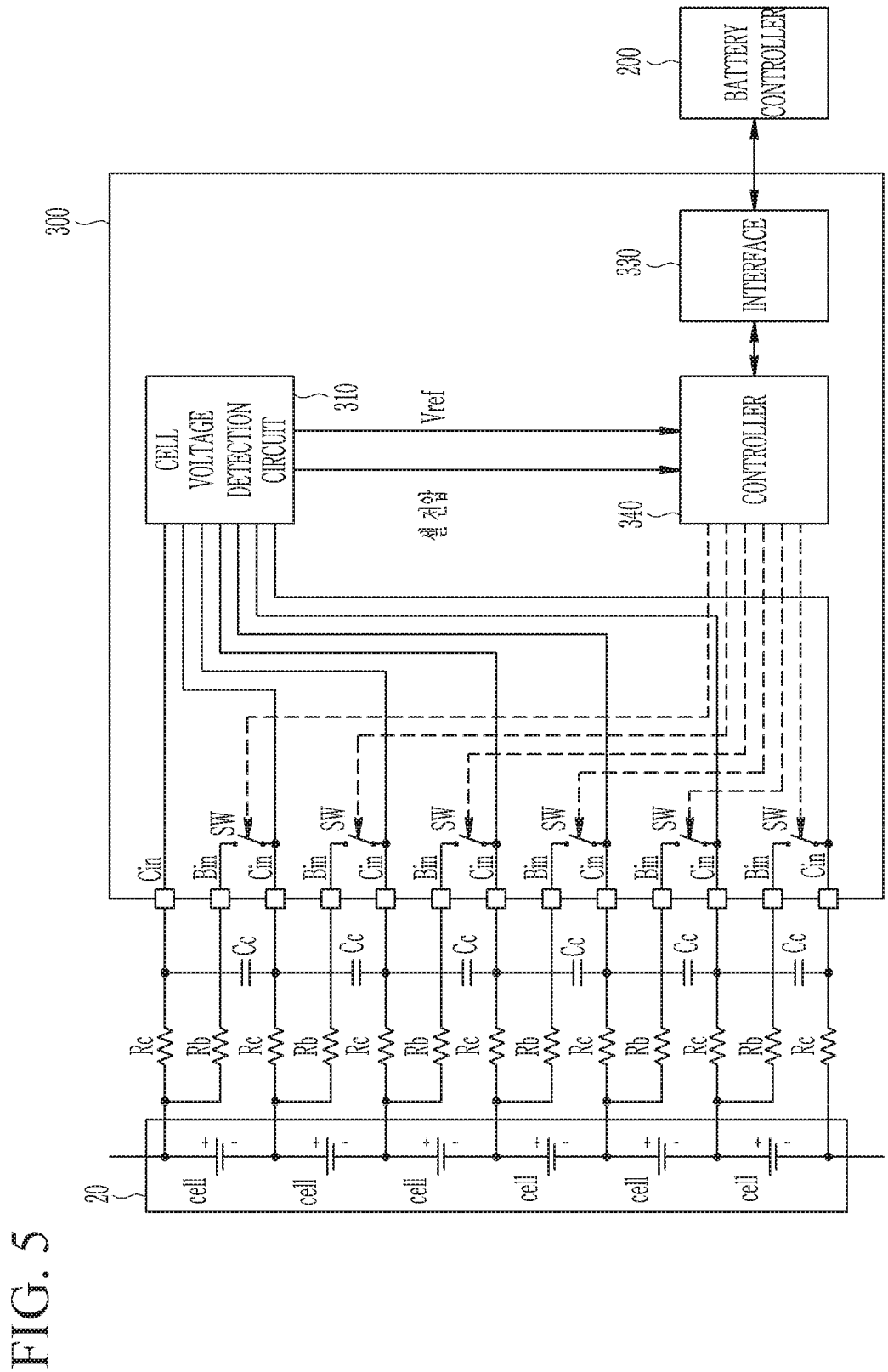
FIG. 5 schematically illustrates a battery management system according to another exemplary embodiment.

FIG. 5 schematically illustrates a battery management system according to another exemplary embodiment.

Referring to FIG. 5, a battery management system according to the present exemplary embodiment may include a voltage detection IC 300 and a battery controller 200. In the following, detailed descriptions of same or similar components as those of the battery management system described with reference to FIG. 1 to FIG. 3 will be omitted.

The voltage detection IC 300 may include a plurality of cell balancing switches SW, a voltage detection circuit 310, an interface 330, and a controller 340.

The voltage detection IC 300 may be electrically connected to a cell group 20 to detect a cell voltage of each cell constituting the cell group 20 through the voltage detection circuit 310.

The voltage detection circuit 310 includes a multiplexer (see reference numeral 111 of FIG. 2), a differential amplifier (see reference numeral 112 of FIG. 2), an ADC (see reference numeral 113 of FIG. 2), and a reference voltage supply circuit (see reference numeral 114 of FIG. 2).

When one of the cells is selected by the multiplexer, the voltage detection circuit 310 outputs a cell voltage of the selected cell to the controller 340 through the differential amplifier and the ADC.

When the cell voltage is outputted from the voltage detection circuit 310, the controller 340 transfers the cell voltage to the battery controller 200 through the interface 330. The battery controller 200 receiving the cell voltage detection result from the voltage detection IC 300 may control cell balancing, charging, discharging, etc. of the cell group 20 based on the result.

The voltage detection IC 300 may control cell balancing of the cells constituting the cell group 20.

Each cell balancing switch SW is connected between opposite ends of a corresponding cell through a corresponding balancing resistor Rb to conduct or block a flow of a cell balancing current of the corresponding cell under the control of the controller 340.

The controller 340 receives cell balancing control information from the battery controller 200 through the interface 330, and controls turn-on/turn-off of each cell balancing switch SW based on the received cell balancing control information.

In the detection circuit 310, the reference voltage supply circuit for supplying the reference voltage Vref to the ADC is sensitive to temperature. Therefore, in the low temperature environment, a level of the reference voltage Vref outputted from the reference voltage supply circuit is different from at room temperature. The conversion of the ADC is performed based on the reference voltage Vref. Therefore, a change in the level of the reference voltage Vref in the low temperature environment may act as a factor to increase an error of the output value of the ADC.

To solve this problem, the controller 140 continuously monitors the reference voltage Vref supplied from the voltage detection circuit 310 to the ADC, and may perform such control so as to increase the internal temperature of the voltage detecting IC 300 when the reference voltage Vref is out of a predetermined range. That is, when the reference voltage Vref is out of the predetermined range, the controller 140 may determine that the internal temperature of the voltage detection IC 300 is included in the low temperature region, and may turn on at least one cell balancing switch SW to increase the internal temperature of the voltage detection IC 300. Herein, the predetermined range corresponds to a level range of the reference voltage Vref outputted from the reference voltage supply circuit in the room temperature region.

In the turn-on control of the cell balancing switches for increasing the internal temperature of the voltage detection IC 300, the controller 340 may divide the cell balancing switches SW included in the voltage detection IC 300 into a plurality of groups, and alternately turn on each cell balancing switch group. For example, the voltage detection IC 300 may group 3 or 4 cell balancing switches SW, and may alternately turn on each cell balancing switch group. For example, the voltage detection IC 300 may group odd-numbered cell balancing switches SW and even-numbered cell balancing switches SW into different groups, and may alternately turn on each cell balancing switch group.

In the turn-on control of the cell balancing switches for increasing the internal temperature of the voltage detection IC 300, the controller 340 may control a time at which a corresponding cell balancing switch SW is turned on for increasing the temperature to be the same for all the cells. In this case, the influence of the turn-on control of the cell balancing switches SW for temperature rise on the cell balancing may be minimized.

When the reference voltage Vref supplied from the voltage detection circuit 310 to the ADC falls within a predetermined range, the controller 340 turns off all of the cell balancing switches SW that are turned on to raise the temperature, to stop the temperature increase using the cell balancing switches SW.

Figure 6:
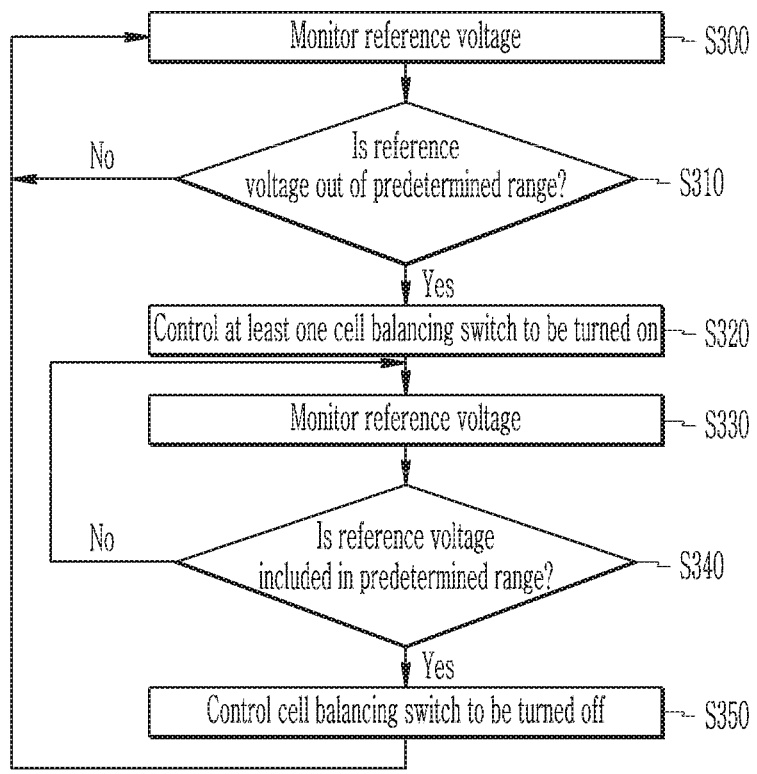
FIG. 6 schematically illustrates a control method of a cell balancing switch of a battery management system according to another exemplary embodiment.

FIG. 6 schematically illustrates a control method of the cell balancing switches of the battery management system of FIG. 5. The control method of the cell balancing switches illustrated in FIG. 6 may be performed by the controller 340 of the voltage detection IC 300 described with reference to FIG. 5.

Referring to FIG. 6, the controller 340 monitors the reference voltage Vref supplied from the voltage detection circuit 310 to the ADC (S300).

The controller 340 determines whether the reference voltage Vref is out of a predetermined range (S310).

When the reference voltage Vref is out of the predetermined range, the controller 340 determines that the internal temperature of the voltage detection IC 300 is included in the low temperature region, and controls at least one cell balancing switch SW to be turned on to increase the internal temperature of the voltage detection IC 300 (S320).

In step S320, the controller 340 may divide the cell balancing switches SW included in the voltage detection IC 300 into a plurality of groups, and may alternately turn on each cell balancing switch group.

In step S320, the controller 340 may control a time at which a corresponding cell balancing switch SW is turned on for increasing the temperature to be the same for all the cells.

The controller 340 continuously monitors the reference voltage Vref while the internal temperature of the voltage detecting IC 300 is being raised through the turn-on control of the cell balancing switches SW (S330). In addition, the controller 340 determines whether the reference voltage Vref is within a predetermined range (S340).

When the reference voltage Vref is within the predetermined range, the controller 340 determines that the temperature of the voltage detection IC 300 reaches a normal range (room temperature region), and controls all the cell balancing switches SW that are turned on for increasing the temperature to be turned off (S350), to stop heat generation of the cell balancing switches SW.

Figure 7:
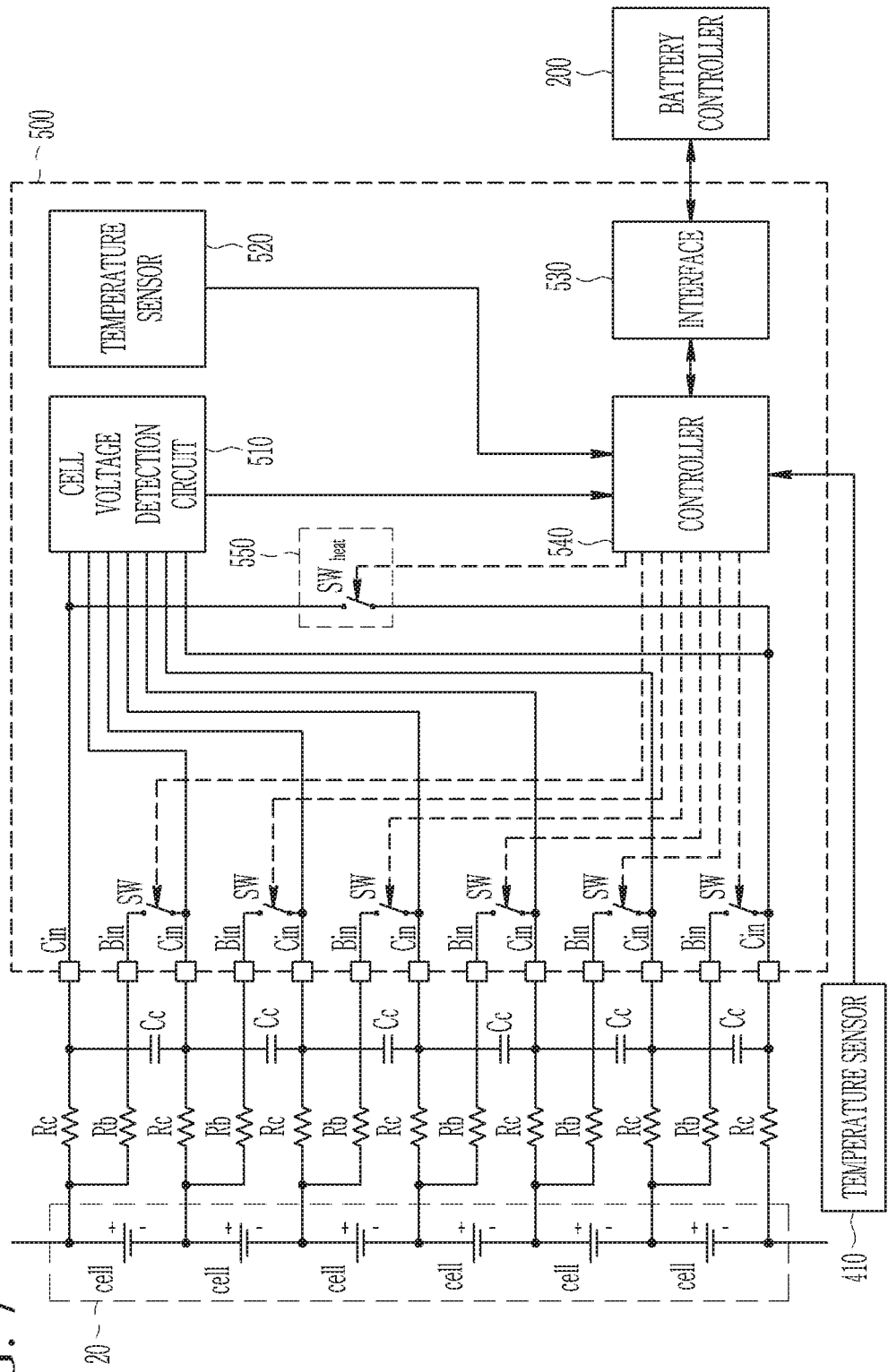
FIG. 7 schematically illustrates a battery management system according to another exemplary embodiment.

FIG. 7 schematically illustrates a battery management system according to another exemplary embodiment.

Referring to FIG. 7, a battery management system according to the present exemplary embodiment may include a voltage detection IC 500 and a battery controller 200. In the following description, detailed descriptions of same or similar components as those of the battery management system described with reference to FIG. 1 to FIG. 3 will be omitted.

The voltage detection IC 500 may include a plurality of cell balancing switches SW, a voltage detection circuit 510, a temperature sensor 520, an interface 530, and a controller 540.

The voltage detection IC 500 may be electrically connected to a cell group 20 to detect a cell voltage of each cell constituting the cell group 20 through the voltage detection circuit 510.

The voltage detection circuit 510 includes a multiplexer (see reference numeral 111 of FIG. 2), a differential amplifier (see reference numeral 112 of FIG. 2), an ADC (see reference numeral 113 of FIG. 2), and a reference voltage supply circuit (see reference numeral 114 of FIG. 2).

When one of the cells is selected by the multiplexer, the voltage detection circuit 510 outputs a cell voltage of the selected cell to the controller 540 through the differential amplifier and the ADC.

When the cell voltage is outputted from the voltage detection circuit 510, the controller 540 transfers the cell voltage to the battery controller 200 through the interface 530. The battery controller 200 receiving the cell voltage detection result from the voltage detection IC 500 may control cell balancing, charging, discharging, etc. of the cell group 20 based on the result.

The voltage detection IC 500 may control cell balancing of the cells constituting the cell group 20.

Each cell balancing switch SW is connected between opposite ends of a corresponding cell through a corresponding balancing resistor Rb to conduct or block a flow of a cell balancing current of the corresponding cell under the control of the controller 540.

The controller 540 receives cell balancing control information from the battery controller 200 through the interface 530, and controls turn-on/turn-off of each cell balancing switch SW based on the received cell balancing control information.

The temperature sensor 520 may detect an internal temperature of the voltage detection IC 500. The reference voltage supply circuit (see reference numeral 114 in FIG. 2) is sensitive to temperature, and thus acts as a cause of a cell voltage detection error in a low temperature region. Therefore, the temperature sensor 520 may be disposed in contact with or adjacent to the reference voltage supply circuit so as to be able to detect an ambient temperature of the reference voltage supply circuit.

The controller 540 may turn on at least one cell balancing switch SW to increase the internal temperature of the voltage detection IC 500 when the internal temperature detected through the temperature sensor 520 is included in the low temperature region. That is, the controller 540 may turn on at least one cell balancing switch SW to increase the temperature when the temperature detected through the temperature sensor 520 is below a threshold value. Herein, the threshold value is a boundary value for determining the low temperature region, and may be set differently depending on an environment in which the battery management system is mounted.

When a cell balancing switch SW is turned on, a balancing current Ib flows into the internal resistor (see reference numeral Rsw in FIG. 3) of the cell balancing switch SW to cause the cell balancing switch SW to generate heat. The heat generation of the cell balancing switch SW may operate as a heat source for increasing the internal temperature of the voltage detection IC 500.

In the turn-on control of the cell balancing switches for increasing the internal temperature of the voltage detection IC 500, the controller 540 may divide the cell balancing switches SW included in the voltage detection IC 500 into a plurality of groups, and alternately turn on each cell balancing switch group. For example, the voltage detection IC 500 may group 3 or 4 cell balancing switches SW, and may alternately turn on each cell balancing switch group. For example, the voltage detection IC 500 may group odd-numbered cell balancing switches SW and even-numbered cell balancing switches SW into different groups, and may alternately turn on each cell balancing switch group.

In the turn-on control of the cell balancing switches for increasing the internal temperature of the voltage detection IC 500, the controller 540 may control a time at which a corresponding cell balancing switch SW is turned on for increasing the temperature to be the same for all the cells. In this case, the influence of the turn-on control of the cell balancing switches SW for temperature rise on the cell balancing may be minimized.

When the internal temperature of the voltage detection IC 500 detected through the temperature sensor 520 is out of the low temperature range, the controller 540 turns off all of the cell balancing switches SW that are turned on to raise the temperature, to stop the temperature increase using the cell balancing switches SW.

As described above, when the internal temperature of the voltage detection IC 500 is increased by using the cell balancing switches SW, the internal temperature of the voltage detection IC 500 may be rapidly increased within a short time. However, when the internal temperature of the voltage detection IC 500 is out of the low temperature range and the cell balancing switches SW are turned off, a situation in which the temperature of the voltage detection IC 500 again falls to the low temperature region by the ambient temperature (e.g., cell temperature) of the voltage detection IC 500 may occur. In addition, when a turn-on state of the cell balancing switches SW is continuously maintained to prevent this situation, excessive discharge of the cells may adversely affect cell cycle-life and cell balancing.

Therefore, the battery management system may further include a temperature sensor 410 for detecting the ambient temperature of the voltage detection IC 500, as illustrated in FIG. 7. The voltage detecting IC 500 may further include a heat generation circuit 550 for maintaining the internal temperature of the voltage detection IC 500.

The temperature sensor 410 may be disposed adjacent to the voltage detection IC 500 to detect the ambient temperature of the voltage detection IC 500. For example, when a printed circuit board (PCB) including a voltage detection IC 500 is attached to the cell group 20, the temperature sensor 410 may be attached to the cell group 20. Further, for example, the temperature sensor 410 may be used by being attached to a printed circuit board including the voltage detection IC 500.

When the internal temperature of the voltage detection IC 500 is out of the low temperature range, and the cell balancing switches SW are turned off, the heat generation circuit 550 may be controlled based on the ambient temperature of the voltage detection IC 500 detected through the temperature sensor 410.

When the ambient temperature detected through the temperature sensor 410 is included in the low temperature range in a state where the internal temperature of the voltage detection IC 500 is out of the low temperature range, the controller 540 may control the heat generation circuit 550 to generate heat in order to prevent the internal temperature of the voltage detection IC 500 from being lowered again by the ambient temperature. In addition, the controller 540 may control the heat generation circuit 550 to stop the heat generation when the ambient temperature detected through the temperature sensor 410 is out of the low temperature range.

The heat generation circuit 550 may be disposed in contact with or adjacent to a reference voltage supply circuit (refer to reference numeral 114 in FIG. 2) serving as a cause of a cell voltage detection error in the low temperature region.

The heat generation circuit 550 may be implemented in various forms that are capable of generating heat.

For example, as illustrated in FIG. 7, the heat generation circuit 550 includes a heat generation switch $SW_{heat}$. The controller 540 may control the heat generation of the heat generation circuit 550 by controlling turn-on and turn-off of the heat generation switch $SW_{heat}$.

When the heat generation switch $SW_{heat}$ is turned on, a current flows through internal resistance of the heat generation switch $SW_{heat}$ so as to allow the heat generation switch $SW_{heat}$ to generate heat. The generation of the heat generation switch $SW_{heat}$ may operate as a heat source for increasing or maintaining the internal temperature of the voltage detection IC 500.

The heat generation switch $SW_{heat}$ may be connected between a positive terminal of any one of the plurality of cells constituting the cell group 20 and a negative terminal of any one of the plurality of cells constituting the cell group 20. For example, referring to FIG. 7, the heat generation switch $SW_{heat}$ may be connected between a positive terminal of a highest potential cell and a negative terminal of a lowest potential cell among the cells constituting the cell group 20. However, the present invention is not limited thereto, and a cell of the cell group which is connected with the heat generation switch $SW_{heat}$ is may be changed.

Although a case where the heat generation switch $SW_{heat}$ is connected with the cell group 20 through the input resistor Rc is illustrated in FIG. 7 as an example, the present invention is not limited thereto, and opposite ends of the heat generation switch $SW_{heat}$ may be connected with the cell group 20 through a separate resistor (not illustrated). In this case, the resistor connected between the opposite ends of the heat generation switch $SW_{heat}$ and the cell group 20 may be disposed inside the voltage detection IC 500 to constitute the heat generation circuit 500 together with the heat generation switch $SW_{heat}$.

Figure 8:
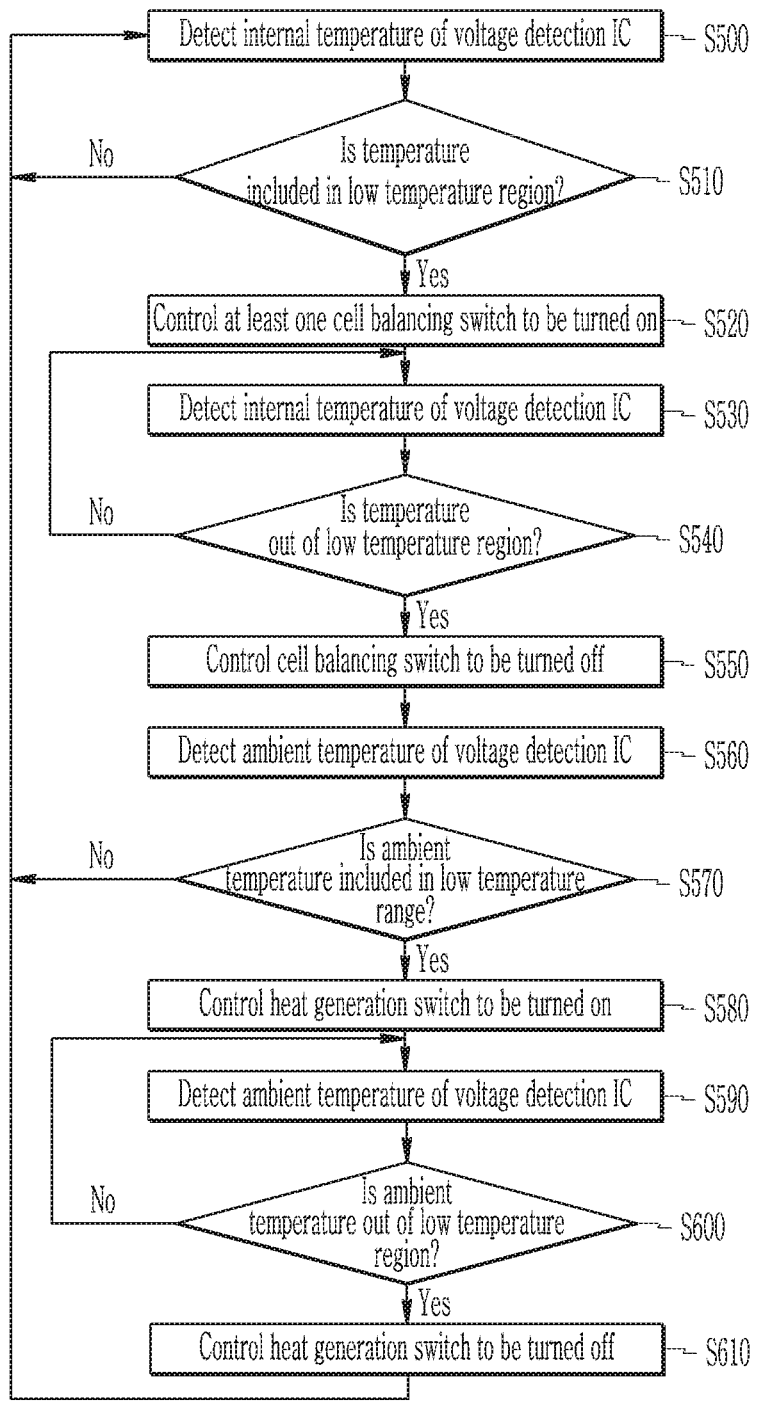
FIG. 8 schematically illustrates a control method of a cell balancing switch of a battery management system according to another exemplary embodiment.

FIG. 8 schematically illustrates a control method of the cell balancing switches of the battery management system of FIG. 7. The control method of the cell balancing switches illustrated in FIG. 8 may be performed by the controller 540 of the voltage detection IC 500 described with reference to FIG. 7.

Referring to FIG. 8, the controller 540 detects the internal temperature of the voltage detection IC 100 through the temperature sensor 520 (S500).

The controller 540 determines whether the temperature detected through the temperature sensor 520 is included in the low temperature region by comparing the temperature detected through the temperature sensor 520 with a threshold value (S510).

The controller 540 controls at least one cell balancing switch SW to be turned on to increase the internal temperature of the voltage detection IC 500 when the temperature detected through the temperature sensor 520 is included in the low temperature region (S520).

In step S520, the controller 540 may divide the cell balancing switches SW included in the voltage detection IC 500 into a plurality of groups, and may alternately turn on each cell balancing switch group.

In step S520, the controller 540 may control the number of cell balancing switches SW that are simultaneously turned on to be different depending on the temperature detected through the temperature sensor 520. In this case, the controller 540 may control the number of cell balancing switches SW to be simultaneously turned on to increase as the temperature detected through the temperature sensor 520 is lower.

In step S520, the controller 540 may turn on all the cell balancing switches SW at the same time, and then may control the cell balancing switches SW such that the number of cell balancing switches SW that are turned off gradually increases depending on the temperature rise.

In step S520, the controller 540 may control a time at which a corresponding cell balancing switch SW is turned on for increasing the temperature to be the same for all the cells.

The controller 540 continuously detects the internal temperature of the voltage detection IC 500 through the temperature sensor 520 even while raising the internal temperature of the voltage detection IC 500 through the turn-on control of the cell balancing switches SW (S530). In addition, the controller 140 determines whether the temperature detected through the temperature sensor 520 is out of the low temperature range (S540).

When the temperature detected through the temperature sensor 520 is out of the low temperature range, the controller 540 controls all the cell balancing switches SW that are turned on for increasing the temperature to be turned off (S550), to stop heat generation of the cell balancing switches SW.

In addition, the controller 540 detects the ambient temperature of the voltage detection IC 500 through the temperature sensor 410 (S560). The controller 540 determines whether the ambient temperature detected through the temperature sensor 410 is included in the low temperature region by comparing the temperature detected through the temperature sensor 410 with a threshold value (S570).

When the ambient temperature detected through the temperature sensor 410 is included in the low temperature region, the controller 540 turns on the heat generation switch $SW_{heat}$ to allow the heat generation circuit 550 to generate heat in order to prevent the internal temperature of the voltage detection IC 500 from being lowered (S580).

The controller 540 continuously detects the ambient temperature of the voltage detection IC 500 through the temperature sensor 410 even in a state where the heat generation switch $SW_{heat}$ is turned on (S590). In addition, the controller 540 determines whether the ambient temperature detected through the temperature sensor 410 is out of the low temperature range (S600).

When the ambient temperature detected through the temperature sensor 410 is out of the low temperature range, the controller 540 controls the cell balancing switches SW that are turned on for maintaining the temperature to be turned off (S6100), to stop heat generation of the heat generation circuit 500.

Although a case where the controller 540 controls a heat generation amount of the heat generation circuit 550 through a turn-on time of the heat generation switch $SW_{heat}$ is illustrated in FIG. 8 as an example, the present invention is not limited thereto. The controller 540 may control a heat generation amount of the heat generation switch $SW_{heat}$ through PMW control that varies a duty ratio of the heat generation switch $SW_{heat}$ depending on a heat generation amount that is required while the ambient temperature of the voltage detection IC 500 stays in the low temperature region. In addition, the controller 540 may control the heat generation amount by adjusting a turn-on and turn-off period of the heat generation switch $SW_{heat}$. In this case, the controller 540 may calculates a required heat generation amount based on a difference between the ambient temperature detected through the temperature sensor 410 and the internal temperature detected through the temperature sensor 520, and may control the turn-on and turn-off period or the duty ratio of the heat generation switch $SW_{heat}$.

Although a case where the heat generation switch $SW_{heat}$ is turned on after the cell balancing switches SW are turned off due to an increase in the internal temperature of the detection IC 500 is illustrated in FIG. 8 as an example, the cell balancing switches SW and the heat generation switch $SW_{heat}$ may be simultaneously turned on in order to increase the internal temperature of the voltage detecting IC 500. In this case, even when the internal temperature of the voltage detection IC 500 is increased, and thus the cell balancing switches SW are turned off, the heat generation switch $SW_{heat}$ may be maintained in the turn-on state until the ambient temperature is out the low temperature range.

Figure 9:
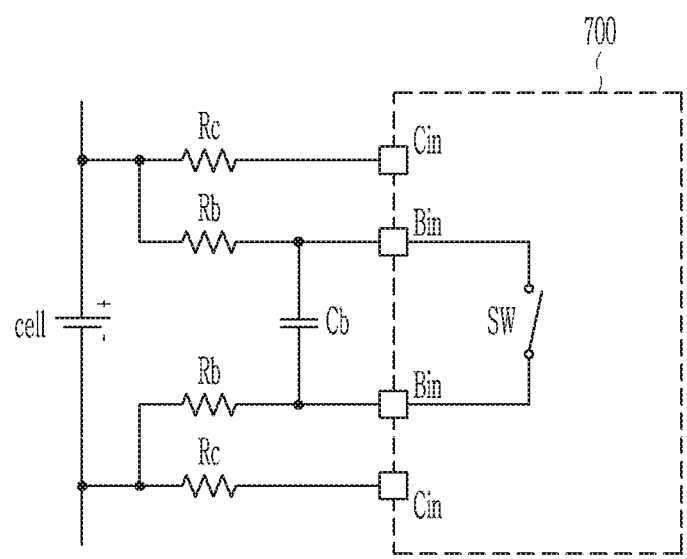
FIG. 9 schematically illustrates a battery management system according to another exemplary embodiment.

Although a case where a measuring route of cell voltages of each of the cells of the voltage detection IC 100 or 300 and a cell balancing route share the input resistor Rc connected with the negative electrode of each cell is described as an example in the aforementioned exemplary embodiments, the present invention is not limited thereto. For example, referring to FIG. 9, a voltage detection IC 700 may measure cell voltages through input resistors Rc connected with opposite ends of the respective cells, and may perform cell balancing through balancing resistors Rb connected with the opposite ends of the respective cells in addition to the input resistors Rc. The voltage detection IC 700 of FIG. 9 may additionally include terminals Cin for measuring the cell voltages and terminals Bin for the cell balancing, unlike the voltage detection ICs 100, 300, and 500 in which the cell balancing route shares one of the terminals Cin for measuring the cell voltages. In FIG. 9, a capacitor Cb connected between the balancing terminals Bin is for preventing a malfunction from occurring due to noise such as a ripple voltage during diagnosis of the balancing switches SW.

Although a case where the function of controlling the cell balancing switch SW to raise the internal temperature of the voltage detection ICs 100, 300, and 500 is controlled by the controllers 140, 340, and 540 included in the voltage detection ICs 100, 300, and 500 is described as an example in the aforementioned exemplary embodiments, the present invention is not limited thereto, and the function of controlling the cell balancing switch SW to raise the internal temperature of the voltage detection ICs 100, 300, and 500 may be performed by the battery controller 200. In this case, the controller in the voltage detection IC may transfer temperature information of the inside or the periphery of the voltage detection IC or level information of the reference voltage Vref to the battery controller through the interface, and may receive control information of the heat generation switch $SW_{heat}$ or the cell balancing switches SW for increasing the temperature from the battery controller.

These exemplary embodiments provide methods for increasing the internal temperature of the voltage detection IC in the low temperature environment so as to improve the accuracy of the voltage detection IC in the low temperature environment, thereby improving the accuracy of the SOC.

Conventionally, due to the inaccuracy of the SOC calculated by the battery management system, the available capacity of the battery is calculated by providing an internal margin sufficient for the SOC error in order to secure the safety of the battery pack when the battery pack is manufactured. For example, when the available range of the battery is between 10% and 90% of the total capacity of the battery, and the SOC output error is ±5%, the actual available battery life will be reduced to 15% to 85% of the battery's total capacity. That is, the available battery capacity is 80% of the total capacity of the battery, but due to the SOC error, actual battery usage takes place within 70% of the total capacity of the battery. Therefore, if the SOC error is reduced, the actual capacity of the battery may be increased.

Further, in the exemplary embodiments, the temperature of the voltage detection IC may be increased without any additional cost by using the cell balancing switches to raise the internal temperature of the voltage detection IC in the low temperature environment.

While exemplary embodiments of the present invention have been particularly shown and described with reference to the accompanying drawings, the specific terms used herein are only for the purpose of describing the invention and are not intended to define the meanings thereof or be limiting of the scope of the invention set forth in the claims. Therefore, those skilled in the art will understand that various modifications and other equivalent embodiments of the present invention are possible. Consequently, the true technical protective scope of the present invention must be determined based on the technical spirit of the appended claims.

DESCRIPTION OF SYMBOLS

20: cell group
100, 300, 500, 700: voltage detection IC
110, 310, 510: voltage detection circuit
111: multiplexer
112: differential amplifier
113: ADC
114: reference voltage supply circuit
120, 410, 520: temperature sensor
130, 330, 530: interface
200: battery controller
550: heat generation circuit
SW: cell balancing switch
$SW_{heat}$: heat generation switch

The invention claimed is:

1. A voltage detection integrated circuit comprising:
a voltage detection circuit electrically connected to a plurality of cells to detect a cell voltage of a corresponding one of the plurality of cells;
a plurality of cell balancing switches configured to conduct or block a flow of a balancing current of a corresponding cell from among the plurality of cells;
a temperature sensor configured to detect an internal temperature of the voltage detection integrated circuit; and
a controller configured to differently select a number of cell balancing switches that are simultaneously turned on depending on the internal temperature, and to turn on the selected switches, when the internal temperature is below a first threshold value,
wherein the number of cell balancing switches that are simultaneously turned on when the internal temperature is between a first temperature and a second temperature is greater than the number of cell balancing switches that are simultaneously turned on when the internal temperature is between the second temperature and a third temperature, the third temperature being higher than the second temperature and the second temperature being higher than the first temperature, and
wherein the number of cell balancing switches that are simultaneously turned on when the internal temperature is between the second temperature and the third temperature is greater than the number of cell balancing switches that are simultaneously turned on when the internal temperature is between the third temperature and a fourth temperature, the fourth temperature being higher than the third temperature.

2. The voltage detection integrated circuit of claim 1, wherein the controller groups the plurality of cell balancing switches into a plurality of groups and alternately turns on the plurality of groups when the internal temperature is less than the first threshold value.

3. The voltage detection integrated circuit of claim 2, wherein the controller controls turn-on times of the plurality of groups to be the same.

4. The voltage detection integrated circuit of claim 1, wherein the controller simultaneously turns on the plurality of cell balancing switches when the internal temperature is less than the first threshold value, and then gradually increases the number of cell balancing switches that are turned off as the internal temperature rises.

5. The voltage detection integrated circuit of claim 1, wherein the voltage detection integrated circuit includes:
   a multiplexer configured to select one of the plurality of cells;
   a differential amplifier configured to amplify and output a voltage between opposite ends of the cell selected by the multiplexer;
   a reference voltage supply circuit configured to supply a reference voltage; and
   an analog digital converter configured to output a digital value corresponding to a cell voltage of the cell selected by the multiplexer based on the reference voltage, wherein the temperature sensor is disposed in contact with or adjacent to the reference voltage supply circuit.

6. A voltage detection integrated circuit comprising:
   a voltage detection circuit electrically connected to a plurality of cells to detect a cell voltage of a corresponding one of the plurality of cells;
   a plurality of cell balancing switches configured to conduct or block a flow of a balancing current of a corresponding cell among the plurality of cells;
   a temperature sensor configured to detect an internal temperature of the voltage detection integrated circuit;
   a controller configured to differently select a number of cell balancing switches that are simultaneously turned on depending on the internal temperature, and to turn on the selected switches, when the internal temperature is below a first threshold value; and
   a heat generation circuit,
   wherein the controller receives an ambient temperature of the voltage detection integrated circuit from a temperature sensor outside the voltage detection integrated circuit, and controls the heat generation circuit to generate heat when the ambient temperature is lower than a second threshold in a state where the internal temperature reaches the first threshold value and thus the plurality of cell balancing switches are turned off.

7. The voltage detection integrated circuit of claim 6, wherein
   the heat generation circuit includes a heat generation switch connected between a positive terminal of a first one of the plurality of cells and a negative terminal of a second one of the plurality of cells.

8. The voltage detection integrated circuit of claim 7, wherein
the controller turns off the heat generation switch when the ambient temperature is equal to or higher than the second threshold.

9. The voltage detection integrated circuit of claim 7, wherein
the controller calculates a heat generation amount of the heat generation circuit based on the internal temperature and the ambient temperature, and PWM-controls the heat generation switch with a duty ratio corresponding to the heat generation amount.

10. The voltage detection integrated circuit of claim 7, wherein
the controller calculates a heat generation amount of the heat generation circuit based on the internal temperature and the ambient temperature, and controls a turn-on and turn-off period of the heat generation switch depending on the heat generation amount.

11. The voltage detection integrated circuit of claim 7, further comprising
a heat generation resistor connected between the heat generation switch and the positive terminal of the first one or between the heat generation switch and the negative terminal of the second one.

12. A battery management system comprising:
   an integrated circuit configured to include a voltage detection circuit that is electrically connected to a plurality of cells to detect a cell voltage of a corresponding cell of the plurality of cells, a plurality of cell balancing switches that conduct or block a flow of a balancing current of a corresponding cell from among the plurality of cells, and a first temperature sensor; and
   a battery controller configured to differently select a number of cell balancing switches that are simultaneously turned on depending on an internal temperature of the integrated circuit detected through the first temperature sensor when the internal temperature is less than a threshold value, and to turn on the selected switches,
   wherein the battery controller is configured to control the integrated circuit to generate heat when an ambient temperature is lower than a second threshold in a state where the internal temperature reaches the threshold value and thus the plurality of cell balancing switches are turned off.

13. The battery management system of claim 12, wherein the battery controller groups the plurality of cell balancing switches into a plurality of groups and alternately turns on the plurality of groups when the internal temperature is less than the threshold value.

14. The battery management system of claim 13, wherein the battery controller controls turn-on times of the plurality of groups to be the same.

15. The battery management system of claim 12, wherein the battery controller simultaneously turns on the plurality of cell balancing switches when the internal temperature is less than the threshold value, and then gradually increases the number of cell balancing switches that are turned off as the internal temperature rises.

16. The battery management system of claim 12, further comprising
   a second temperature sensor configured to detect the ambient temperature of the integrated circuit,
   wherein the integrated circuit further includes a heat generation circuit that generates heat depending on the ambient temperature.

17. The battery management system of claim 16, wherein the battery controller controls the heat generation circuit to generate heat when the ambient temperature is lower than the second threshold in the state where the internal temperature reaches the threshold value and thus the plurality of cell balancing switches are turned off.

18. The battery management system of claim 17, wherein the heat generation circuit includes a heat generation switch connected between a positive terminal of a first one of the plurality of cells and a negative terminal of a second one of the plurality of cells.

19. The battery management system of claim 18, wherein the battery controller turns off the heat generation switch when the ambient temperature is equal to or higher than the second threshold.

20. The battery management system of claim 17, wherein the battery controller calculates a heat generation amount of the heat generation circuit based on the internal temperature and the ambient temperature, and controls turn-on and turn-off of a heat generation switch depending on the heat generation amount.

* * * * *